United States Patent
Polese et al.

(10) Patent No.: US 6,250,127 B1
(45) Date of Patent: Jun. 26, 2001

(54) HEAT-DISSIPATING ALUMINUM SILICON CARBIDE COMPOSITE MANUFACTURING METHOD

(75) Inventors: Frank J. Polese; Jack A. Rubin, both of San Diego; Michael J. Singer, San Marcos, all of CA (US); Walter V. Chichra, Wappingers Fall; Anthony P. Grodio, Lagrangeville, both of NY (US); Vlad Ocher; Henry Escalante, both of San Diego, CA (US); William Dixon, Escondido, CA (US); David L. Rose, Cardiff, CA (US); Stuart Weinshanker, San Diego, CA (US)

(73) Assignee: Polese Company, Inc., CA (US)

( * ) Notice: Subject to any disclaimer, the term of this patent is extended or adjusted under 35 U.S.C. 154(b) by 0 days.

(21) Appl. No.: 09/415,698

(22) Filed: Oct. 11, 1999

(51) Int. Cl.[7] .................................................. B21C 23/00

(52) U.S. Cl. .............................. 72/256; 72/379.2; 72/700

(58) Field of Search .................................... 72/253.1, 256, 72/258, 330, 331, 340, 365.2, 379.2, 700; 29/890.03

(56) References Cited

U.S. PATENT DOCUMENTS

| | | | |
|---|---|---|---|
| 4,698,663 | 10/1987 | Sugimoto et al. | 357/81 |
| 4,759,995 | 7/1988 | Skibo | 428/614 |
| 4,786,467 | 11/1988 | Skibo et al. | 420/129 |
| 4,828,008 | 5/1989 | White et al. | 164/66.1 |
| 4,865,806 | 9/1989 | Skibo et al. | 420/129 |
| 4,943,490 | 7/1990 | Bruski et al. | 428/614 |
| 4,994,417 | 2/1991 | Yamada et al. | 501/90 |
| 5,083,602 | 1/1992 | Skibo | 164/97 |
| 5,167,920 | 12/1992 | Skibo et al. | 420/548 |
| 5,186,234 | 2/1993 | Hammond et al. | 164/97 |

(List continued on next page.)

FOREIGN PATENT DOCUMENTS 5-255822 * 10/1993 (JP) ........................................ 72/256

OTHER PUBLICATIONS

SmartDie ® Product Manufacturing and Us, PP: 1–8 Sep. 3, 1999.

Thermally Enhanced Lids for Flip Chip Devices, Stu Weinshanker; Paul Mescher, IMAPS Advanced Technology Workshop Flip Chip Technology, Mar. 12–14, 1999.

Electronics Cooling, Thermal Interface materials, Dr. Miksa DeSorgo, Sep. 3, 1999.

1999 International Symposium on Microelectronics, Oct. 26–28, 1999 sponsored by IMAPS (International Microelectronics ADN Packaging Society) "Enhancement of Thermal Performance of Mass–Producible Al–SiC for MPUs and Electric Vehicles".

Development of Low Cost Sintered Al–SiC Composite, Yamagata et al; International Symposium on Microelectronics Sponsored By IMAPS (International Microelectronics and Packaging Society) Nov. 1–4, 1998.

* cited by examiner

*Primary Examiner*—Ed Tolan
(74) *Attorney, Agent, or Firm*—Henri J. A. Charmasson; John D. Buchaca

(57) ABSTRACT

A process for low cost manufacturing light-weight, heat-dissipating structures such as heatsinks, heat spreaders, and covers or lids for microelectronic components such as flip-chip integrated circuits from difficult-to-machine metal matrix composites such as aluminum silicon carbide (generically referred to as "Al—SiC" or "AlSiC"). The process involves selecting a mass produced quantity of Al—SiC material, forming that material into a thin ribbon, then stamping/coining the ribbon into the structures. The ribbon can be formed by extruding a thin strip from a billet of the Al—SiC material, then plurally rolling it. In this way, commonly available AlSiC composites manufactured in high volume for use in other applications such as cast automotive parts may be used.

17 Claims, 2 Drawing Sheets

U.S. PATENT DOCUMENTS

| | | | |
|---|---|---|---|
| 5,246,057 | 9/1993 | Hansson et al. | 164/97 |
| 5,299,724 | 4/1994 | Bruski et al. | 266/207 |
| 5,384,087 * | 1/1995 | Scorey | 419/10 |
| 5,394,928 | 3/1995 | Hammond et al. | 164/97 |
| 5,402,843 | 4/1995 | Skibo | 164/97 |
| 5,494,868 | 2/1996 | Newkirk et al. | 501/127 |
| 5,505,248 | 4/1996 | Aghajanian et al. | 164/97 |
| 5,529,108 | 6/1996 | Newkirk et al. | 164/97 |
| 5,531,425 | 7/1996 | Skibo et al. | 266/208 |
| 5,571,346 | 11/1996 | Bergsma | 148/550 |
| 5,585,671 | 12/1996 | Nagesh et al. | 257/697 |
| 5,613,189 * | 3/1997 | Carden | 428/565 |
| 5,620,804 | 4/1997 | Kennedy et al. | 428/609 |
| 5,672,435 * | 9/1997 | Born et al. | 428/539.5 |
| 5,701,943 | 12/1997 | Young | 164/97 |
| 5,789,810 * | 8/1998 | Gross et al. | 257/704 |
| 5,828,127 | 10/1998 | Yamagata et al. | 257/706 |
| 5,846,350 | 12/1998 | Bergsma | 148/549 |
| 5,927,130 * | 7/1999 | Watson et al. | 72/258 |

\* cited by examiner

HEAT-DISSIPATING ALUMINUM SILICON CARBIDE COMPOSITE MANUFACTURING METHOD

FIELD OF THE INVENTION

This invention relates to materials science and powder metallurgy, and more particularly to the manufacturing of heat-dissipating component parts used in electronic systems, and microelectronic circuitry packaging, and other applications using lightweight heat-dissipating structures.

BACKGROUND OF THE INVENTION

Although the present invention is applicable to many areas of technology requiring heat dissipating structures having low density and adjustable thermal expansion characteristics, its details will be described in terms of its application to electronics, and particularly with respect to the fabrication of heat-dissipating flip-chip covers or lids.

Nowadays, most electronic microcircuit components require the use of structures which are capable of dissipating the heat generated by the active parts of the microcircuit. Moreover, those structures in direct contact with one another must have compatible thermal expansion characteristics. Otherwise, stresses caused by the disproportionate expansion may damage components or reduce thermal dissipation efficiency.

The coefficient of thermal expansion ("CTE") or simply the thermal expansion of a material is defined as the ratio of the change in length per degree Celsius to the length at 25° C. It is usually given as an average value over a range of temperatures.

The thermal conductivity ("K" or "TC") of a material is defined as the time rate of heat transfer through unit thickness, across unit area, for a unit difference in temperature or K=WL/AT where W=watts, L=thickness in meters, A=area in square meters, and T=temperature difference in ° K or ° C.

The constant drive toward further microcircuit miniaturization has resulted in the creation of the so-called "flip-chip" type of microcircuit as disclosed in Sugimoto et al., U.S. Pat. No. 4,698,663 and Nagesh et al., U.S. Pat. No. 5,585,671 incorporated herein by this reference. The flip-chip design offers lower electrical resistance, faster clock speeds, and lower cost assembly. Referring now to FIG. 1, a flip-chip integrated circuit die 1 has a plurality of solder bumps 2 arranged on its underside to electrically interconnect the die to a circuit board 3. Typically, an underfill layer 4 of electrically insulating epoxy further bonds the die to the circuitboard reducing mechanical stresses created by the die-to-circuitboard CTE mismatch. However, most commercially practical thermal epoxies have relatively poor thermal conductivity, typically ranging between 0.2 and 20 W/°K.

Therefore, as shown in FIGS. 2 and 3, the need for greater heat dissipation resulted in the development of a heat dissipating cover or lid structure 5, also known as a heat spreader; which is bonded to the upper surface of the die 1 using a layer of thermally conductive adhesive 6 such as thermal epoxy. A stiffener 7 laterally surrounds the die and bonds the periphery 8 of lid to the circuit board thereby enclosing and protecting the die, preserving good contact at the die-to-lid interface, and allowing the use of non-adhesives such as thermal grease at the interface. FIGS. 3 and 4 shows that the stiffener may be integrated with the lid by forming the lid 9 to have a thickened periphery or flange 10 terminating at the inner edge walls 11,12 forming an underside cavity 13. FIG. 3 also shows the need for lids having a uniformly smooth and flat upper surface for intimately contacting a top mounted radiator 14.

Due to the relatively poor thermal conductivity of the interface layer between the die and the lid, minimum thickness is desired, leading to the need for a smooth, flat lid undersurface. However, if adhesive is used, a thinner epoxy layer is less capable of accommodating any expansion mismatch between the die and the lid, leading to breaks in the contact interface.

The use of flip-chip type integrated circuits with organic substrates having relatively low thermal conductivity makes thermally efficient lids even more critical.

In many applications such as aerospace electronics, overall reduction in weight is desirable.

As disclosed in Yamagata, et al., *Development of Low Cost Sintered Al—SiC Composite,* 1998 International Symposium on Microelectronics, Nov. 1–4, 1998, incorporated herein by this reference, it has been found useful to form such heat-dissipating structures from adjustable CTE, relatively high thermal conductivity, lightweight metal matrix composites such as aluminum-silicon-carbide ("Al—SiC"). Al—SiC is a metal matrix composite wherein silicon carbide ("Sic") particles are dispersed in an aluminum ("Al") or aluminum alloy matrix. The proportions of the Al to the Sic are selected to provide a compatible overall CTE while maintaining high thermal conductivity along with acceptable other characteristics such as homogeneity, smoothness and flatness, with good oxidative and hermetic stability.

Al—SiC composites having volume fractions of at least 20% Sic enjoy overall CTEs of less than $17 \times 10^{-6}/°C$. which compares favorably with the CTE of the microcircuit or an intermediate buffer layer, while maintaining thermal conductivities in the range of about 130 W/m° K to 210 W/m° K and lightweight densities of between about 2.8 g/cm$^3$ and about 3.0 g/cm$^3$.

Another advantage of Al—SiC over other heat dissipating materials such as copper and most copper based metal matrix composites is that Al—SiC has greater oxidative stability, and does not require surface treatment as does Cu.

Although it may seem trivial, Al—SiC also has a smooth relatively light colored surface which readily carries ink printing. Copper based structures require an additional plating step to achieve such a surface.

However, current methods of manufacturing Al—SiC lids is expensive. One method disclosed in Yamagata, et al. Supra. involves thoroughly mixing aluminum and silicon carbide powders, compacting the mixture into a preform of the lid then sintering the preform.

Various other methods have been proposed for manufacturing heat-dissipating structures from AlSiC, such as disclosed in Yamada et al., U.S. Pat. No. 4,994,417 and Newkirk et al., U.S. Pat. No. 5,529,108, incorporated herein by this reference. These methods generally involve infiltrating molten aluminum or aluminum alloy into a porous preform of SiC particles. Other methods involve blendin Sic particles into moltan aluminum, then casting as disclosed in Hammond et al. U.S. Pat. No. 5,186,234.

Although infiltration, casting and mix-and-sinter methods can achieve near net-shape structures, those structures demanding high-tolerance dimensioning often require additional machining. Due the hardness and abrasiveness of SiC, Al—SiC composites containing even low volume fractions of SiC are difficult to machine. Even expensive diamond and carbide cutting tools exhibit rapid wear. Many heatsinks and heat-dissipating support or covering structures such as flip-chip lids have complex shapes and benefit from high volume fractions of SiC, making machining even more costly. Currently, a large amount of expensive machining is required to form the these finished structures even from preformed, near net shape Al—SiC structures.

Also, the composites themselves are subjected to stresses during machining which may cause chipping or other deformations. Thin structures such as flip-chip lids can have planar portions having surface areas of up to 2500 square cm and be between 1.1 and 4.0 mm thick, and are correspondingly more susceptible to machining damage.

Although the above techniques involve creation of the composite material in the near net-shape of the finished structure, this means that each lid is fabricated individually, from the start. Such individual processing can reduce manufacturing volume and increase overall cost.

Also, another drawback of infiltration methods is the typical formation of a "skin" of aluminum or aluminum alloy on the outer surface of the composite which can cause surface warping due to larger local CTE. Therefore, the skin is usually removed using an expensive machining step. This problem is worsened when near net-shape parts are made, since these parts may have more complex shapes and each part must be machined individually.

Therefore, the instant invention results from a need in the electronics field for high volume, low cost manufacturing of Al—SiC microelectronic heat-dissipating structures.

SUMMARY OF THE INVENTION

The principal and secondary objects of this invention are to provide an inexpensively manufactured, lightweight microelectronic heat-dissipating structure such as a flip-chip lid having a CTE compatible with microcircuit material, and adequately uniform smoothness and flatness.

These and other objects are achieved by selecting a mass produced quantity of Al—SiC material, forming that material into a thin ribbon, then stamping/coining the ribbon into the structures such as flip-chip lids. The ribbon can be formed by extruding a thin strip from a billet of AlSiC material, then plurally hot rolling the strip. In this way, commonly available AlSiC composites manufactured in high volume for use in other applications such as cast automotive parts may be used.

DESCRIPTION OF THE PREFERRED EMBODIMENT OF THE DRAWING

Figure 1:
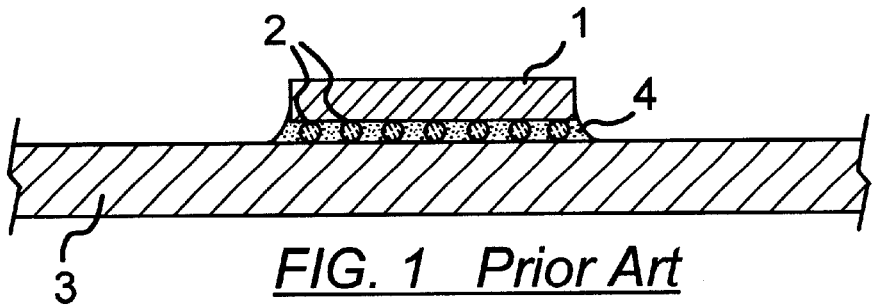
FIG. 1 is a prior art diagrammatic cross-sectional view of a flip-chip type integrated circuit die mounted upon a circuit board.
Figure 2:
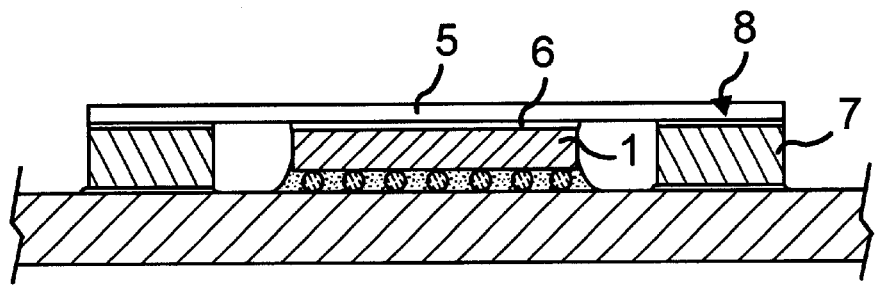
FIG. 2 is a prior art diagrammatic cross-sectional view of a flip-chip type integrated circuit die mounted upon a circuit board, and having a heat dissipating lid with stiffener.
Figure 3:
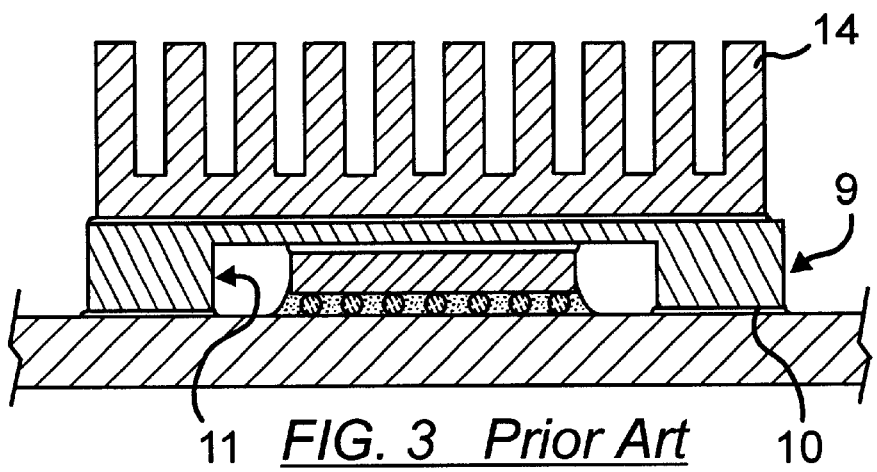
FIG. 3 is a prior art diagrammatic cross-sectional view of a flip-chip type integrated circuit die mounted upon a circuit board, and having a heat dissipating lid and a radiator.
Figure 4:
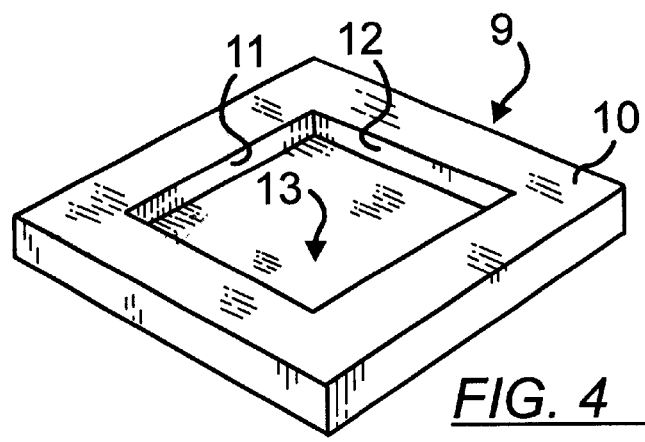
FIG. 4 is a prior art diagrammatic perspective view of an inverted flip-chip lid showing its underside.
Figure 5:
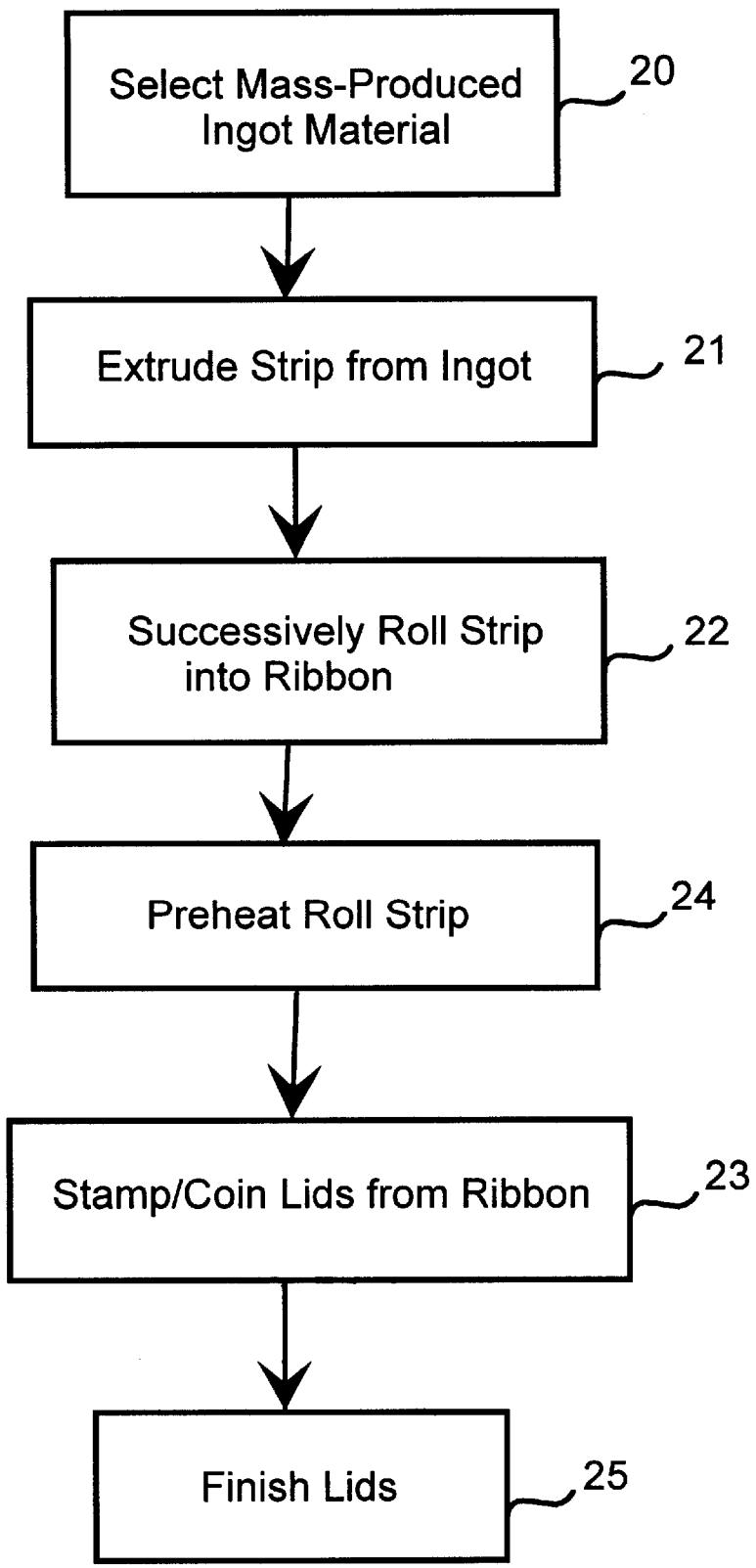
FIG. 5 is a flow chart diagram of the preferred manufacturing steps of the invention.

The preferred embodiment of the invention will be describe in relation to the manufacture of an Al—SiC flip-chip lid. It is clear to those skilled in the art that the invention is applicable to the manufacture of other structures such as heatsinks, heat-dissipating buffer layers, printed circuit board stiffeners, and pallets made from difficult-to-machine metal matrix composites.

In a first embodiment, a mass-produced, relatively inexpensive Al—SiC metal matrix composite ingot 20 or billet is selected having a volume fraction of between about 10 and about 40 volume percent SiC particles having an average particle size of between about 1 and about 50 microns. The remainder of the billet is the matrix material, such as aluminum or aluminum alloy and various additives or residuals. This results in the composite having a CTE between about $12 \times 10^{-6}/°C$. and $17 \times 10^{-6}/°C$.

The ratio of SiC reinforcement to Al matrix material is determined by the application. Where closer contact between die-to-lid is desired, volume fractions in the upper end of the range and higher may be necessary resulting in a closer CTE match. However, better matching CTE material may not be mass-produced to the extent necessary for the economic benefit of the invention to be realized.

In general, for most common flip-chip lid applications where the lid is bonded directly to the substrate, volume fractions as low as 10 percent SiC may be adequate. Further, in those situations involving contact between the lid and an organic package or substrate, low volume fractions and the attendant higher CTE enhance the lid-to-substrate bond.

The invention allows for the use of relatively inexpensive mass-produced Al—SiC composite commonly used in the automotive parts industries. Such Al—SiC is made using various well-known methods and is commercially available in the range of 10 to 50 volume percent SiC, from Duralcan of Detroit, Mich.; LEC of Newark, Del.; and DWA of Chatsworth, Pa.

The billet is of a size and shape which may be readily loaded into a vertical or horizontal extruder. For typical currently available extruders, the billet mass preferably ranges between about 1 and about 250 pounds, and preferably is cylindrical in shape having a length ranging between about 0.25 meter and about 2.0 meters, and a diameter ranging between about 2.0 centimeters and about 50 centimeters. Such Al—SiC ingots or billets are currently commercially available from the above listed companies.

The billet is then hot extruded 21 at a temperature of between about 450 and 1150 degrees Fahrenheit under a pressure of between about 100 and 2500 tons depending on the type of extruder used. This results in an extrusion output rate of between about 10 and about 45 feet per minute to form a wrought strip which measures between about 0.25 and about 10 inches wide by about 0.025 and about 0.25 inch thick which is wound upon a spool. To reduce extrusion die wear, a lubricant such as a graphite in water from the Deltaforge series produced by Acheson Colloids Company of Port Huron, Mich. may be used.

The dimensions of the strip are selected to accommodate the later rolling steps in a two high type rolling mill. Those skilled in the art will readily appreciate the differently dimensioned strips may be selected for different rolling machinery.

Preferably, the extruded strip is preheated to between about 700° F. and about 800° F. just prior to rolling. Such heating may be accomplished using an induction type heater such as those available from Lepel Corporation of Edgewood, N.Y. Alternately, or additionally, the mill rollers themselves may be heated. If the strip is not preheated, the rollers are preferably heated to between about 300 and about 600 degrees C. assuming a roller speed of between about 1 and about 20 feet per minute.

The strip is then rolled 22 one or more times to achieve a stamp-ready ribbon. Of course fewer rollings would be preferred to reduce manufacturing costs. However, the structure of the strip may be damaged if the single pass reduction in thickness is too drastic. Therefore, depending on the thickness of the extruded strip and the thickness of the intended finished lid, a plurality of rollings may be required to create a stamp-ready ribbon. Further, some between pass treatment of the strip such as annealing may be necessary, especially if drastic per pass reduction is performed.

For each rolling step, it has been found preferable to use speeds of between about 1 and 20 feet per minute, and a roller spacing which results in single pass thickness reduction of between about 5 and 50 percent, and most preferably between about 10 and about 25 percent.

Depending on the milling machine used and, more importantly, the material forming the rollers, their speed and pressure, a roller lubricant is generally preferred. A vegetable oil based lubricant such as peanut oil or PAM brand cooking spray, available from International Home Foods company Parsippany, N.J. has been found adequate.

It is understood that after extrusion and between one or more of the rolling passes, various processing steps such as shearing, annealing, stripping, drying and/or cleaning may be required to remove imperfections caused by the rolling and any intermediate handling of the strip and in preparation of subsequent steps.

Successive portions of the thin ribbon are then stamped 23 to form each of a number of lids. Such stamping individualizes each lid from the ribbon stock. Heretofore, all processing has occurred on the Al—SiC sheet, ribbon, strip, or billet which comprises the material for many lids, thereby allowing more efficient low-cost manufacturing. It is understood that manufacturing costs per lid will decrease as more lids can be stamped from a given ribbon stock. Therefore, the amount of Al—SiC material selected to form the ribbon should be sufficient to preferably make a plurality of lids, more preferably at least 10 lids, even more preferably at least 100 lids and most preferably, at least 1000 lids.

In general, the term "stamping" has come to mean pressing a portion of stock material such as a ribbon to separate off or individualize a part for later processing. The term "coining" generally means pressing an existing part or plug so as to reshape it without removing a large portion of material. The term "forging" generally means stamping or coining while the material has been heated.

Single machines are currently available which perform both processes in one or more stations depending on the complexity of the lid or part. Multiple stage diestamping/coining is commonly known as "progressive-stamping". In this specification, the pressing step or steps which individualizes a part from the ribbon stock will be referred to as "stamping". Each later pressing which reshapes the part will be referred to as "coining". It is possible to practice the invention using a so called "one hit coin" approach wherein stamping and coining occur in a single pressing. However, such a method can suffer from high die wear. Anoteher method allows for a so-called "bubble" to be formed by the upward movement of material when the underside cavity of the lid is formed. The bubble is ground away in a machining/finishing step. Another method avoids formation of the "bubble" by using multiple coining steps. This method is effective when the cavity depth is less than about 40% of the final thickness of the lid.

Due to the hardness and abrasiveness of Al—SiC, the stamping or coining die or tool is preferably made from hard material such as tool steel, for example tool steel type A2 or D2, or more preferably a carbide material such as cobalt tungsten carbide, or those materials having a metal such as nickel or iron bonded in combination with a refractory hard metal carbide such as titanium carbide or tantalum carbide.

Prior to stamping, the ribbon is preferably preheated to between about 100 and 600 degrees Fahrenheit, and more preferably between 450 and 500° F. using an induction type heater to minimize cracking and maintain flatness.

A stamping machine such as an automated mechanical press capable of delivering between about 20 and about 50 tons per square inch is preferred. Of course the pressure is dictated by the size and number of lids stamped on each stroke.

The prestamped ribbon is sized and the individual, portions of a multi-lid die are located to allow for a clearance between lids and the edges of the ribbon of preferably about three times the thickness of the ribbon. The clearance allows for a clean cut edge on the periphery of each lid and a degree of inaccuracies in the stamping machine.

In the case of flip-chip lids having an underside cavity, care should be taken to accurately orient the upper stamp tool and lower stamp tool. Further, there should be bubble clearance on the stamp tool of no more than 40% of the ribbon thickness. Dwell is preferably set between about 5 and about 15 degrees of each 360 degree stroke.

The die are manually or automatically lubricated between each stroke. Lubricants such as vegetable oil based lubricants are preferred due to cleanliness and flash point properties.

The part may then be coined, if necessary, to bring the part into final dimension and flatness. In general, this means using a more precisely toleranced set of upper and lower dies than in the previous stamping step. The precoined size and shape of the lid, which is referred to as a plug, is selected to allow the material in the center to be slightly drawn and flattened, while the final profile of the edge walls and flange are formed.

The part can then be ground or lapped, if necessary, to precisely bring the surfaces to final flatness and finish 25. Also, any final machining such as the drilling of holes may be performed.

The lids are then placed in a high velocity tumbler and tumbled for between about 5 and 25 minutes to remove burrs and provide surface finish.

Various finalization steps may be performed depending on the application. This can include plating, soldering, anodizing, chromating, phosphating, zincating, resurfacing through machining, sputtering, spraying, vapor depositing and etching, and printing.

In general, for microelectronic heat-dissipating structures, overall composite thermal conductivity should be maximized and the overall CTE must be compatible with the adjacent material such as the die, packaging, substrates, or circuit board while taking account for any intermediate layers such as thermal epoxy. For proper contact with a flip-chip microcircuit, a heat-dissipating lid should have a uniformly flat undersurface, which, by flatness measurement micrometer, is preferably less than 0.001 inch and is oxidatively and hydrolytically stable.

The above process results in a structure which has density approaching the theoretical maximum, and has a near uniform disribution of composite particles, and high flatness without the expensive fabrication steps inherent in the prior art.

EXAMPLE 1

This example produced an Al—SiC flip-chip microprocessor lid of roughly 20 final volume percent SiC, a density of about 3.0 g/cc, a CTE of about $8.0 \times 10^{-6}/°C.$, and a thermal conductivity of at least 155 W/m° K.

A 60 lb generally cylindrical, 7 inch diameter billet of Al—SiC having about 20 volume percent SiC. The billet was preheated to a temperature of about 900° F. in a batch type processing furnace then hot extruded in a horizontal extruder at a rate of about 10 feet per minute to form a long Al—SiC strip measuring about 1.5 inches wide and about 170 mil thick wound onto a pickup spool. No lubricant was used.

The extruded strip was then preheated on an induction heater to about 900° F. as it was being fed into a two high rolling mill machine having H13 rollers heated to about 400° F. and running at a speed of about 3.5 feet per minute. The spacing of the rollers was set to reduce the thickness of the strip by about 18 percent per pass. Therefore, after 6 passes the strip had been reduced to a ribbon having a thickness of about 52 mils.

The ribbon was then preheated to about 400° F. and fed into a mechanical press operating at a pressure of about 60 tons and using a progressive die for stamping from the ribbon stock a square plug measuring between 10 and 35 mm on a side and between about 0.9 and 2.03 mm thick. A vegetable oil based lubricant was applied to the stamping die.

The plug was then placed in mechanical press operating at a pressure of about 60 tons and using a single lid creating die pair for coining the plug to form a square lid 18 mm on a side and 1.25 mm thick having 0.625 mm deep cavity. A vegetable oil based lubricant was applied to the coining die.

The invention is readily applicable to other light-weight, heat-dissipating electronic structures desirous of high reliability such as heat dissipating circuit board stiffeners, pallets, heat spreaders, power amplifier heat sinks, and base plates and heat sinks for power modules such as IGBT and MOSFET power modules, and LDMOS support flanges.

While the preferred embodiments of the invention have been described, modifications can be made and other embodiments may be devised without departing from the spirit of the invention and the scope of the appended claims.

What is claimed is:

1. A process for forming a plurality of electronic heat dissipating structures which comprises:
    selecting an amount of mass produced aluminum silicon carbide metal matrix composite;
    forming said amount into a stamp ready ribbon having a thickness between approximately 1 and 2 millimeters;
    heating said ribbon to a temperature between approximately 100 and 600 degrees Fahrenheit;
    stamping and coining said ribbon to form said structures.

2. The process of claim 1, wherein said forming comprises:
    extruding a thin strip from said amount of material; and
    flattening said strip to form said ribbon.

3. The process of claim 2, wherein said flattening comprises first hot rolling said strip.

4. The process of claim 3, wherein said flattening further comprises plurally hot rolling said strip.

5. The process of claim 3, wherein said first hot rolling reduces a thickness of said strip by no more than about 50 percent.

6. The process of claim 3, wherein said first hot rolling reduces a thickness of said strip by no more than about 25 percent.

7. The process of claim 2, wherein said flatting comprises a plurality of hot rolling steps wherein each of said plurality of rolling steps reduces the thickness of said strip by no more than about 50 percent.

8. The process of claim 1, wherein said selecting comprises choosing an amount of aluminum silicon carbide having a volume fraction of SiC between about 10 and about 40 percent.

9. The process of claim 3, wherein said first hot rolling comprises heating said strip to at least 700 degrees Fahrenheit.

10. The process of claim 1, wherein said stamping and coining comprises preheating said ribbon to at least 450 degrees Fahrenheit.

11. The process of claim 1, wherein said amount comprises material sufficient to create a plurality of said structures.

12. The process of claim 1, wherein said amount comprises material sufficient to create at least 1000 of said structures.

13. A process for forming a plurality of heat dissipating flip-chip type lids which comprises:
    selecting an amount of mass produced metal matrix composite;
    forming said amount into a stamp ready ribbon having a thickness between approximately 1 and 2 millimeters;
    heating said ribbon to a temperature of approximately 450 degrees Fahrenheit; and
    stamping and coining said ribbon to form said plurality of lids.

14. The process of claim 13, wherein said stamping and coining comprises:
    forming a cavity having a depth of less than about 40% of the final thickness of each of said plurality of lids;
    wherein said forming avoids creating a bubble on each of said plurality of lids.

15. The process of claim 13, wherein said metal matrix composite comprises a ceramic reinforced metal matrix composite.

16. The process of claim 13, wherein said metal matrix composite comprises aluminum silicon carbide.

17. A heat-dissipating electronic component made from the process of claim 1.

* * * * *

UNITED STATES PATENT AND TRADEMARK OFFICE
CERTIFICATE OF CORRECTION

PATENT NO. : 6,250,127 B1
DATED : June 26, 2001
INVENTOR(S) : Frank J. Polese et al.

It is certified that error appears in the above-identified patent and that said Letters Patent is hereby corrected as shown below:

On the Title page, the listing of inventors, the following should be added:

STEPHEN PATRICK NOOTENS of San Diego, California (US); and RAYMOND J. ROSZKOWICZ of Temecula, California (US).

Signed and Sealed this

Twenty-seventh Day of November, 2001

*Attest:*

*Attesting Officer*

NICHOLAS P. GODICI
*Acting Director of the United States Patent and Trademark Office*